United States Patent
Kulkarni et al.

(10) Patent No.: US 7,328,384 B1
(45) Date of Patent: Feb. 5, 2008

(54) METHOD AND APPARATUS USING DEVICE DEFECTS AS AN IDENTIFIER

(75) Inventors: Chidamber R. Kulkarni, San Jose, CA (US); Gary R. Lawman, San Jose, CA (US); Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 64 days.

(21) Appl. No.: 11/238,781

(22) Filed: Sep. 29, 2005

(51) Int. Cl.
*G01R 31/28* (2006.01)

(52) U.S. Cl. ..................................... 714/725

(58) Field of Classification Search ............... 714/736, 714/725
See application file for complete search history.

(56) References Cited

U.S. PATENT DOCUMENTS

| | | | |
|---|---|---|---|
| 6,085,334 A * | 7/2000 | Giles et al. ............. | 714/7 |
| 6,289,292 B1 | 9/2001 | Charlton et al. | |
| 6,622,102 B2 | 9/2003 | Skidmore | |
| 6,744,274 B1 * | 6/2004 | Arnold et al. ............. | 326/16 |
| 7,185,249 B2 * | 2/2007 | Tkacik et al. ............. | 714/726 |
| 7,251,748 B2 * | 7/2007 | Liberty et al. ............. | 714/20 |
| 2005/0166111 A1 * | 7/2005 | Chien ............. | 714/733 |
| 2006/0282734 A1 * | 12/2006 | Milne et al. ............. | 714/742 |
| 2007/0061672 A1 * | 3/2007 | Eggleston et al. ............. | 714/758 |

OTHER PUBLICATIONS

U.S. Appl. No. 10/737,280, filed Dec. 16, 2003, Trimberger.
U.S. Appl. No. 10/956,556, filed Oct. 1, 2004, Trimberger.

* cited by examiner

*Primary Examiner*—James C. Kerveros
(74) *Attorney, Agent, or Firm*—LeRoy Maunu (57) ABSTRACT

A method and apparatus that uses device defects as an identifier. Data is written to memory of an integrated circuit. Defects are identified based upon the writing of the data. An identifier for the IC is then derived using the identification of the defects.

9 Claims, 9 Drawing Sheets

METHOD AND APPARATUS USING DEVICE DEFECTS AS AN IDENTIFIER

FIELD OF THE INVENTION

This invention relates in general to integrated circuits, and more particularly to a method and apparatus that uses device defects as an identifier of the device.

BACKGROUND

Manufacturers, integrators, customers and others often need to distinguish an individual integrated circuit from others. For example, a user may want to track a circuit's source of manufacture or identify a system employing the integrated circuit. Individually identifiable integrated circuits may be used to validate transactions, route messages, track items, recover stolen goods, etc. Furthermore, many such devices, which conform to certain security protocols, are required to have unique identifiers. The devices may have unique encryption keys to make it difficult to hack into the devices.

Integrated circuits are often manufactured using processing that makes all integrated circuit chips identical, thereby lowering manufacturing costs and improving quality. It has been known to include circuits within a chip that produce a signal identifying the nature or type of the chip. For example, programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

To provide information on a circuit, techniques have been developed for identifying the type of mask-programmed read-only memory (ROM). ROMs of different types may have indistinguishable visible structures and a visible pattern may be produced on the ROM identifying its nature. Further, an embedded system may place a type-specific identifier on the pins of a circuit when stimulated, e.g., specific identification information may be placed into a scan test chain. These methods of identification are useful for indicating the type of component being manufactured or placed in an assembly, but they do not distinguish one individual chip one from another.

It has been also known to customize each individual chip as it is manufactured in order to make it uniquely identifiable. Such customization may be performed as the chip is fabricated or after it is fabricated, for example, by inscribing a unique pattern on its die. In addition, after a chip is fabricated, a programmable ROM may be programmed to store a date, a lot number, a wafer number, and a wafer position, as well as other useful manufacturing data. The information may be read back when an unusual combination of voltages is placed on the input pins and detected by the chip, overriding the normal function of the device.

Other techniques do not result in an electrically detectable modification of the integrated circuit die. Instead, they physically inscribe a pattern onto an unused portion of the die surface, to be observed optically by a machine or by a person using a microscope. For example, a pattern may be placed on electrically inactive areas on each die site on a wafer. This may be done with an additional mask step applied to the whole wafer.

While such methods can provide each chip with a unique identification, they require special processing steps during the semiconductor manufacturing process that add cost and time to the manufacturing process.

Mask read-only memory (ROM) devices are semiconductor memory devices widely used in various digital systems. One of their primary applications is for use as the memory for holding program code and data for microprocessors in digital computer systems. Many mask ROM manufacturers add visually identifiable alphanumeric markings to the device substrate that contain identification codes for distinguishing the mask ROM substrate from others. This identification code is added to the code mask that contains the selection of the transistor cells to be programmed as blocking and is made onto the device substrate when the device is factory-programmed.

Such a conventional process of fabricating the alphanumeric code marking, however, involves the use of multiple photomask layers. The code marking requires two photoresist applications, two photo exposures, as well as one etching procedure. The implementation of the second photomask layer is solely for the purpose of protecting the device area of the mask ROM device when the code marking is being fabricated.

Non-volatile programmable memory such as FLASH, EPROM, fuse, antifuse or laser programming my be included and programmed after manufacturing with a unique or nearly-unique identifier. Non-volatile memory requires additional processing steps, adding cost to products.

As mentioned earlier, many tracking and security functions use a unique device identifier on a chip. However, a mask-programmed memory or a special non-volatile memory process to put the identifier on chip has disadvantages including adding cost to the manufacturing process. Moreover, for many applications, it is not essential that the identifier be unique or sequential. Any number that is difficult to reproduce is acceptable.

It can be seen then that there is a need for a method and apparatus that provides a lost cost, simple, identifier for identifying a particular integrated circuit.

SUMMARY

To overcome the limitations in the prior art described above, and to overcome other limitations that will become apparent upon reading and understanding the present specification, the present invention discloses a method and apparatus that uses device defects as an identifier of the device, specifically an identifier of an integrated circuit (IC).

Embodiments of the present invention solves the above-described problems by using characteristics of memory cells, such as returned test data or interconnect points through a multiplexor, to provide a unique, or nearly unique, identifier that is associated with a particular IC.

A method in accordance with an embodiment of the present invention includes writing data to memory of an integrated circuit, identifying defects based upon the writing of the data and deriving an identifier for the IC using the identification of the defects.

In another embodiment of the present invention, an integrated circuit for providing an identifier based on memory cell defects is provided. The IC includes a configurable array of memory cells, the array comprising a first portion storing user data and a second portion storing error correction code (ECC) data, the array having a read port, an ECC generation and correction circuit having a plurality of input terminals coupled to the read port of the array and a first plurality of output terminals and a controller, coupled to the configurable array of memory cells, the controller configurable to write data to memory cells of the IC, to identify defects based upon the data written to the memory cells and to derive an identifier for the IC using the identification of the defects.

In another embodiment of the present invention, a program storage device is provided. The program storage device includes program instructions executable by a processing device to perform operations for providing an identifier for a IC, the operations including writing data to memory of a IC, identifying defects based upon the writing of the data and deriving an identifier for the IC using the identification of the defects.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus that uses device defects as an identifier of the IC. Characteristics of memory cells, such as returned test data or interconnect points through a multiplexor, are used to provide an identifier that is associated with a particular IC.

Figure 1:
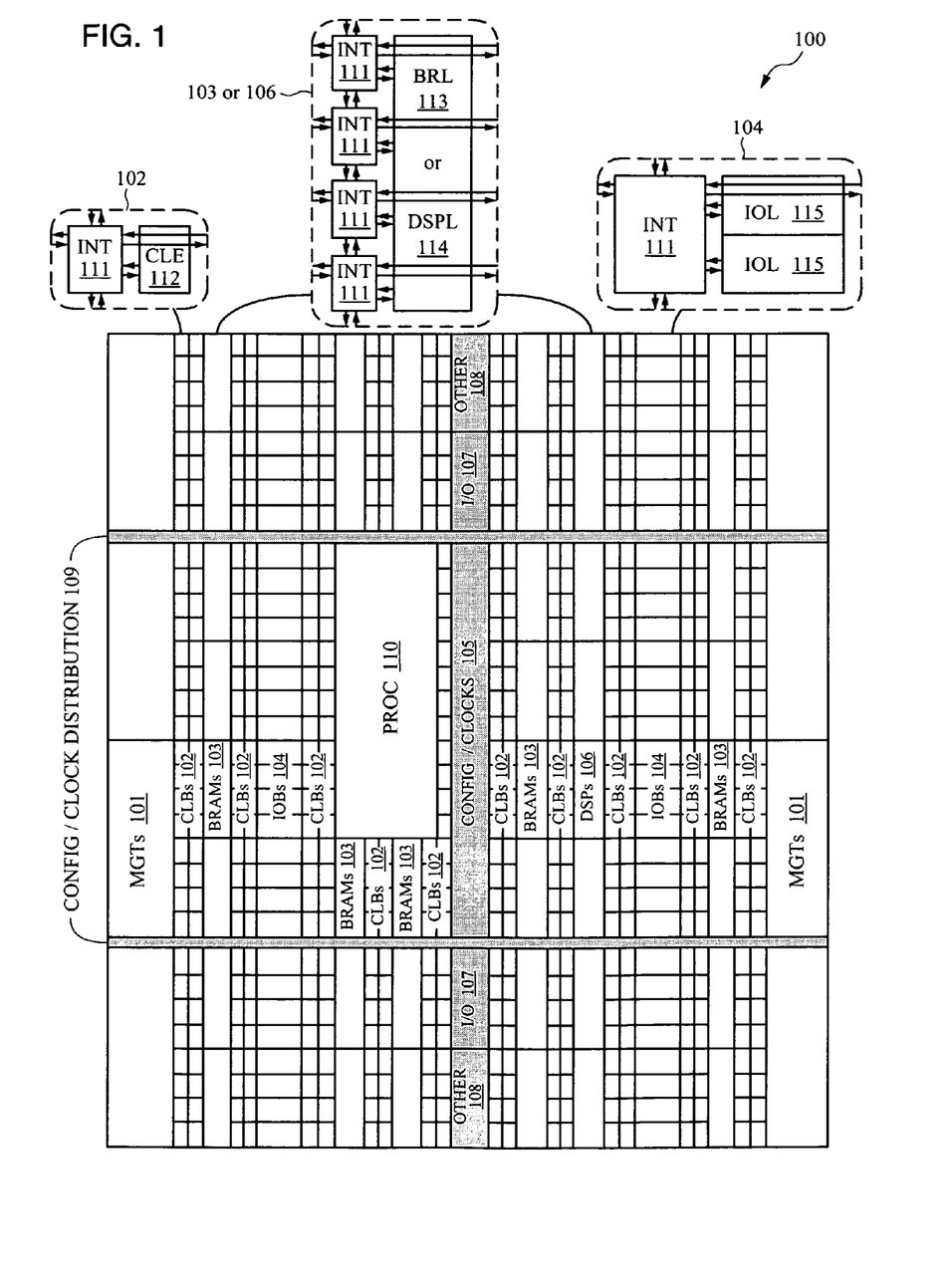
FIG. 1 is a schematic diagram of an embodiment of an FPGA on which various embodiments of the invention may be used.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only one example of an FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are provided purely as one illustration of an FPGA architecture. For example, in an actual FPGA more than one adjacent column of CLBs is typically included wherever the CLBs appear, to facilitate the efficient implementation of user logic.

It will be appreciated that PLDs having different layouts of CLBs, IOBs, and interconnect circuitry (and the functional equivalents thereof) may also implement the various embodiments of the invention described herein.

Figure 2:
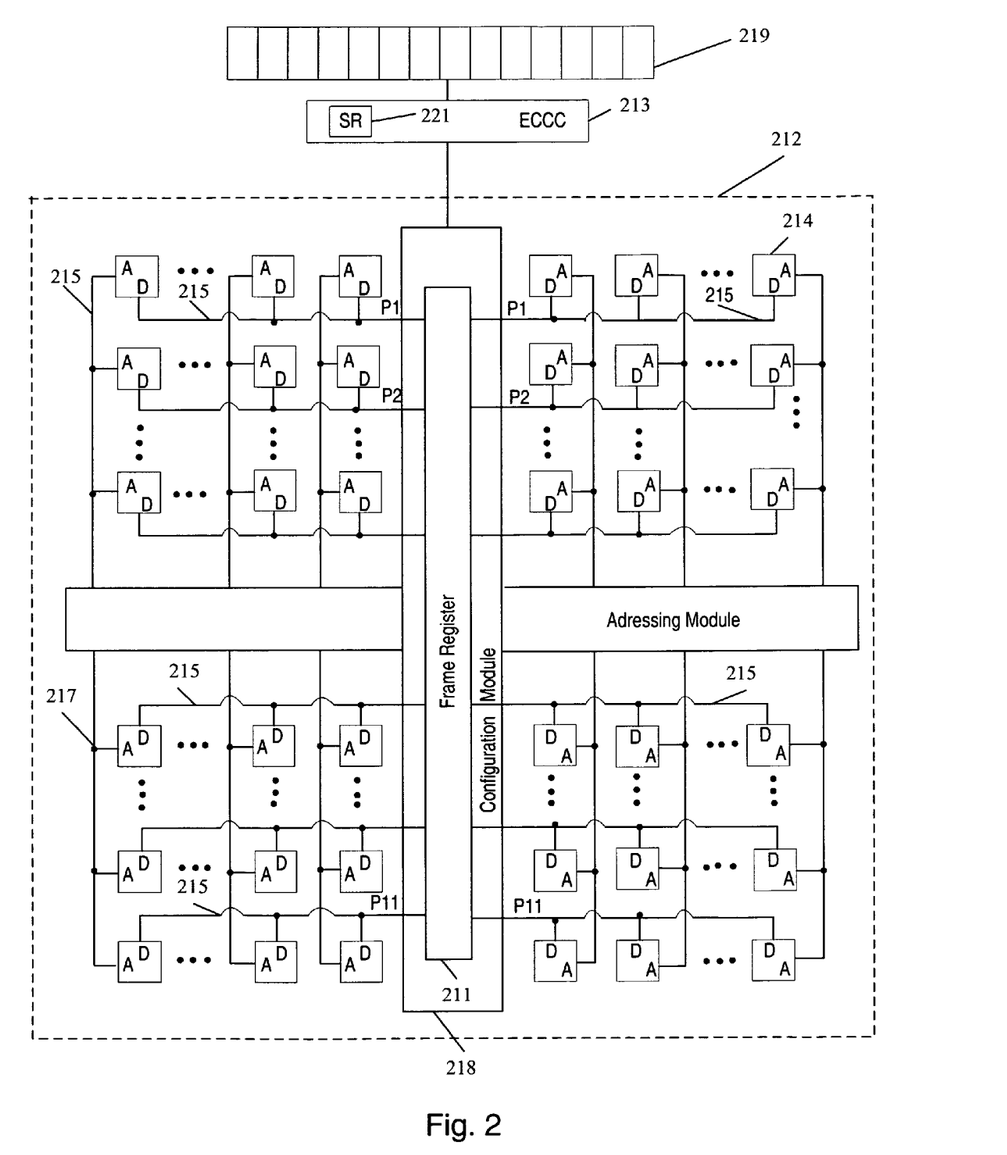
FIG. 2 is a schematic diagram of one embodiment of memory system for an FPGA architecture as illustrated in FIG. 1.

FIG. 2 is a schematic diagram of one embodiment of memory system 200 for an FPGA architecture 100 as illustrated in FIG. 1. The memory system 200 includes an array 212 of memory cells 214, an address module 216 and a configuration module 218. To correct errors an error correcting code circuit (ECCC) 213 and an error check memory 219 may be provided. Circuit 213 and memory 219 are used for detecting and correcting errors in memory cells 214 in array 212. ECCC 213 records status information pertaining to error detection and correction in status register (SR) 221.

Memory cells 214 are arranged in rows and columns. Each memory cell 214 has two inputs. One input, labeled D in FIG. 2, is a data input and is coupled to a frame register 211 of configuration module 218. The other input, labeled A in FIG. 2, is an address input and is coupled to address module 216. A signal applied on address input A controls when data on data input D is written into memory cell 214. In an alternative embodiment, data input D is bidirectional and data may be transferred in either direction between data input D and memory cell 214. In addition, each memory cell 214 has outputs not shown in FIG. 2 that are coupled to the appropriate logic/IO block 106 or routing matrix 110 as illustrated in FIG. 1.

Figure 3:
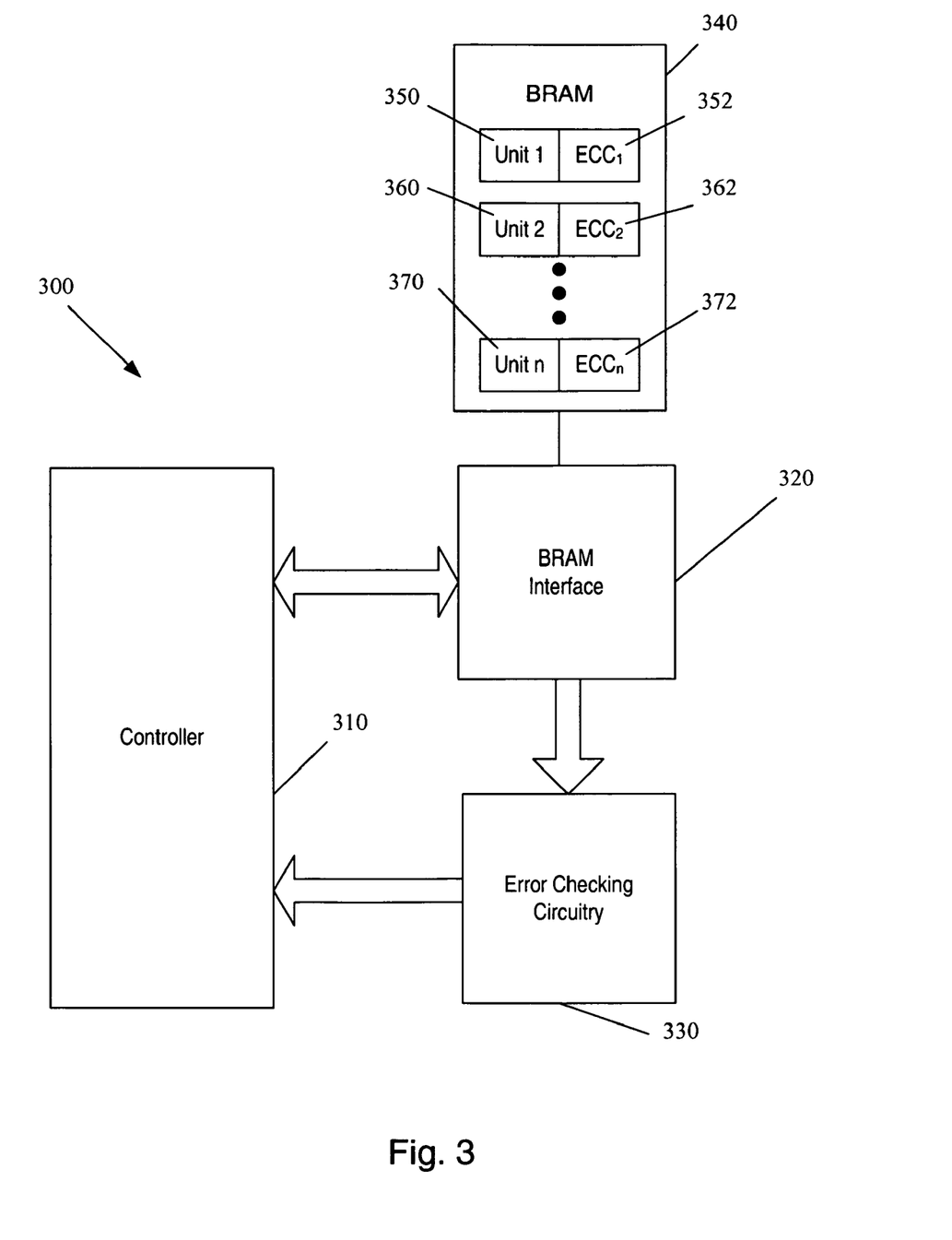
FIG. 3 is block diagram of a controller interface system for providing high-speed detection and correction of soft errors in a configuration memory of a programmable logic device according to an embodiment of the present invention.

FIG. 3 is block diagram of a controller interface system 300 for providing high-speed detection and correction of soft errors in a configuration memory of a programmable logic device according to an embodiment of the present invention. In FIG. 3, a controller core 310 is coupled to a BRAM interface 320 and an error checking circuit 330. Controller core 310 has a bidirectional connection to BRAM interface 320. Output from BRAM interface 320 is also connected to error checking circuitry 330, whose output is connected to controller core 310. Error checking circuitry 330 can be part of controller core 310, but is distinct in FIG. 3. BRAM interface 320 can be any configuration interface on the FPGA that allows large segments of memory units to be read back continuously. Error checking circuitry 330 is any error checking circuitry that can calculate parity on configuration memory as it is read back, so that a result for a given unit is available by the time the unit of memory is read back. The parity code storage may be internal or external to the check circuitry. The parity code may also be embedded into the configuration memory itself, and calculated prior to FPGA configuration or by the controller core. Controller core 310 manages reading and writing of the configuration memory through BRAM interface 320, and monitors and analyzes the output of error checking circuitry 330.

Error checking circuitry 330 calculates the parity for the data. The BRAM 340, which as described above, is a configurable memory module that attaches to a variety of BRAM Interface Controllers. Each unit 350, 360, 370 of BRAM 340 may have its own error correcting code (ECC) 352, 362, 372 associated with it, independent of any other unit in the configuration memory.

According to various embodiments of the invention, the locations of defects in BRAMs or configuration logic may serve as an identifier because the precise memory cell that is defective may be different from chip to chip. For more detail, the fault could be localized in a defective IC. The test may be performed when the IC is manufactured or may be performed on-chip at startup.

In another embodiment, interconnect may be added for redundancy, but not made available in the routing model. Interconnect may be tested and defective interconnect avoided. Since defective interconnect will vary from one IC to another, defective interconnect can serve to generate an identification code. Moreover, the redundant interconnect could be built with more aggressive design rules to increase the chance of failure, such as by removing the redundant vias in the logic, thereby increasing information for IC identification.

Figure 4:
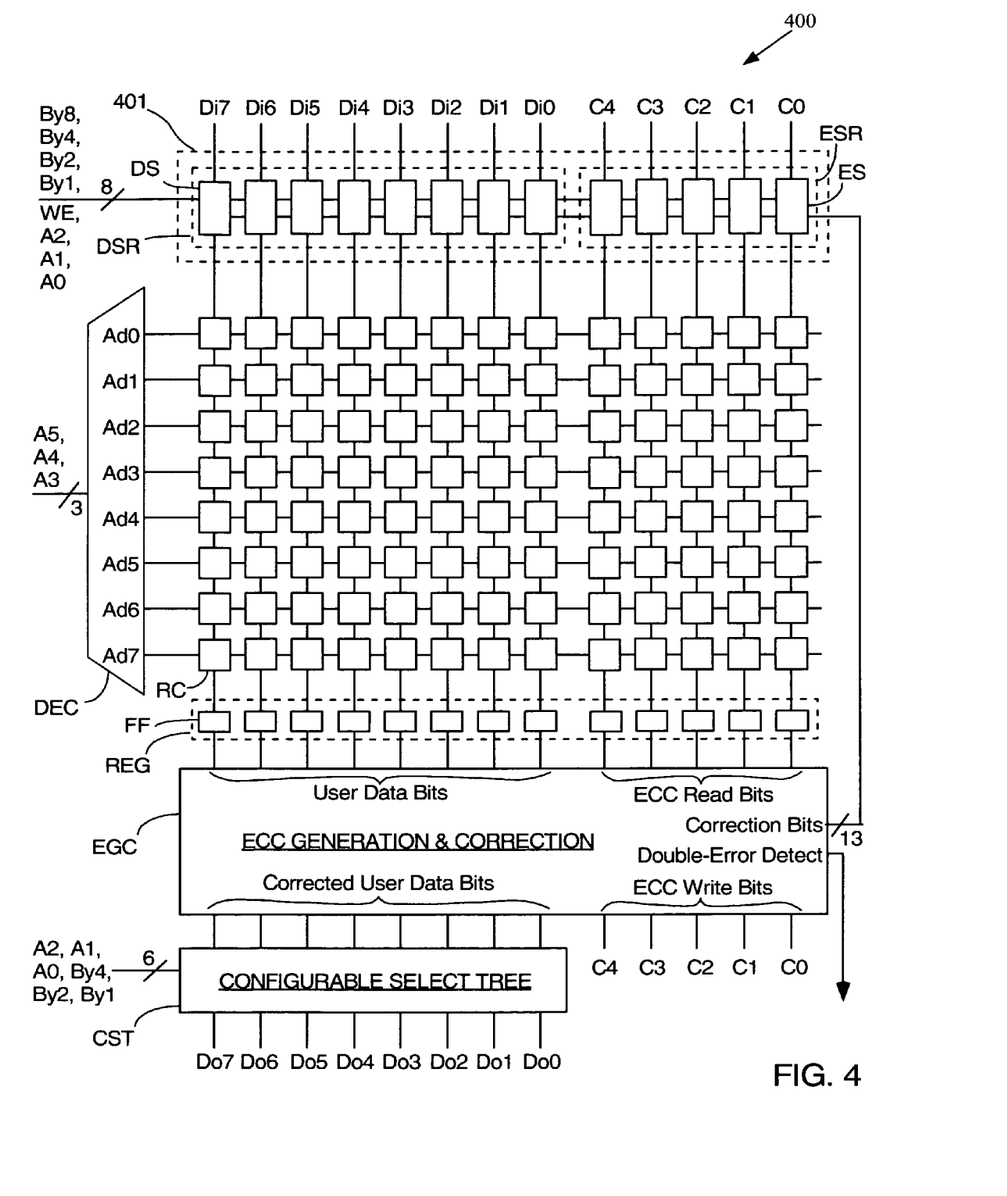
FIG. 4 illustrates a RAM structure providing both a configurable user data word width and error correction capability.

FIG. 4 illustrates a RAM structure 400 providing both a configurable user data word width and error correction capability. The configurable RAM structure 400 of FIG. 4 could be included, for example, in a programmable logic device (PLD) such as a field programmable gate array (FPGA). The memory array of FIG. 4 stores a user data word having a maximum width of eight bits, but can be configured to store user data words having different widths. The principles and structures illustrated in FIG. 4 can easily be extended to larger RAM arrays by those of skill in the relevant arts.

Any type of memory cell which meets implementation and application requirements may be used in the configurable RAM circuit of FIG. 4. The embodiment of a configurable RAM structure 400 shown in FIG. 4 includes an 8-by-13 array of RAM cells (RC). The 8-by-13 array includes a user data portion (the leftmost 8-by-8 array) and an ECC data portion (the rightmost 8-by-5 array). The two portions of the array are addressed by common word lines Ad7-Ad0, but have separate vertical bit lines. The RAM array is addressed by a decoder DEC, which accepts three address bits A5, A4, A3 and decodes the address bits into eight word lines Ad7-Ad0 for the RAM cells RC. Data is written to the RAM array via write port 401. Data (including both user data bits and ECC read bits) is read from the RAM array via the vertical bit lines into an ECC generation and correction circuit EGC.

As described above with reference to FIG. 3, ECC generation and correction circuit EGC generates corrected data for the user data bits, as well as generating new ECC data. The corrected user data bits are provided to a configurable select tree CST. The new ECC data (ECC write bits C4-C0) are provided to write port 401. In the pictured embodiment, ECC generation and correction circuit EGC also provides 13 correction bits that indicate the location of an erroneous bit, when such a bit is detected. The correction bits are used by write port 401 to write the corrected data to a selected bit of the RAM array, by enabling only the tristate driver of the erroneous bit.

In the example of the RAM structure 400 shown in FIG. 4, the well-known Hamming code technique may be used to detect erroneous bits. With a user data word of eight bits, a Hamming code of four bits may be used to detect an error and pinpoint the erroneous bit within the total 12-bit-wide memory word. With the same user data word of eight bits, a Hamming code of five bits may be used to detect a single error and pinpoint the erroneous bit within the 13-bit memory word, and can also detect a second error, but cannot pinpoint the location of the second error. Therefore, in the pictured embodiment ECC generation and correction circuit EGC also provides a "double-error detect" output signal. The double-error detect output signal indicates that more than one erroneous bit was detected, i.e., that an uncorrectable error condition was detected.

In other embodiments (not shown), the corrected user data may be provided as an output Do7-Do0 of the RAM array, but the corrected data is not stored in the RAM array. In other embodiments, a "single-error detect" signal may be provided that indicates the presence of an erroneous bit in the RAM array. Configurable select tree CST provides RAM array output signals Do7-Do0, under the control of address signals A2-A0 and three configuration select signals By4, By2, and By1.

Write port 401 includes two portions, a data select register portion DSR and an ECC select register portion ESR. Data select register DSR is used to write user data to the RAM array, and also (in some embodiments) to write corrected user data to the RAM array. ECC select register ESR is used to write newly generated ECC data to the RAM array, and also (in some embodiments) to write corrected ECC data to the RAM array.

Those skilled in the art will recognize that the embodiment of a RAM structure 400 as shown in FIG. 4 is presented as merely one example of a RAM structure. However, the present invention is not meant to be limited to a particular structure. Rather, embodiments of the present invention are applicable to any device having a plurality of memory locations, wherein the locations of defects may serve as an identifier because the precise memory cell that is defective may be different from chip to chip.

In a configurable error-correctable memory array for an FPGA, such as shown in FIG. 4, the error correction codes identify defective memory cells. The defective memory cells can then be used to provide an identifier for the device.

Figure 5:
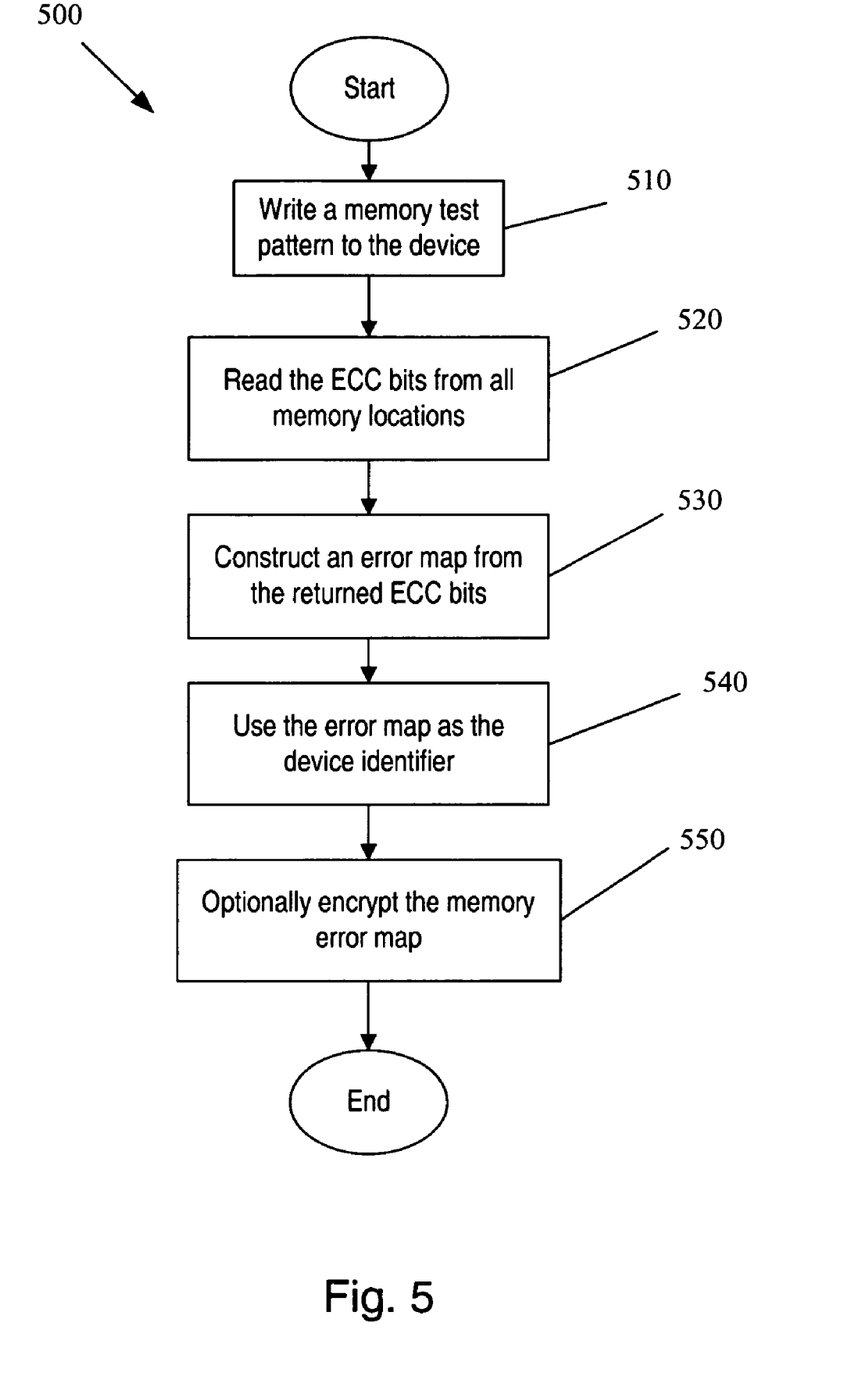
FIG. 5 is a flow chart of a method for identifying a particular device, such as an IC, using memory defects according to one embodiment of the present invention.

FIG. 5 is a flow chart 500 of a method for identifying a particular device using memory defects according to one embodiment of the present invention. In FIG. 5, a memory test pattern is written to the device (step 510). The ECC bits are read from all memory locations, e.g., from all BRAMs of an FPGA, (step 520) after having written the memory test pattern. An error map is constructed from the returned ECC bits (step 530). The error map may then be used as an identifier 540.

Those skilled in the art will recognize that the error map may be further processed to derive a value suitable for use as a device identifier. For example, the error map may be processed to reduce the number of bits used as the identifier. In addition, or alternatively, the error map may be processed to derive a unique value for the identifier, such as by combining a time-date stamp with the error map. The error map may be processed to produce an identifier using one or a combination of approaches, such as lossless compression, addition, multiplication, weighted summing or logic operations.

Typically, there are tens of BRAMs, each providing a plurality of ECC bits. For example, in a 16 Kb memory, with its widest memory organization of 16 bits, the memory array would include 1024 correctable words, each with 5 ECC bits, or over 5000 error correction bits. Thus, there may be hundreds or thousands of bits in a BRAM error map. Since the FPGA is programmable to read any bits, only the ability to turn off error correction and instead read the error syndrome bits is required.

Typically, most of the bits in the BRAM error map will be zero (a bit with a value 1 indicates an error). However, most bits being zero makes the value undesirable for use as an encryption key, which is one application for use of a unique device identifier. In order to turn the hundreds of bits into an acceptable key, the memory error map may be optionally encrypted (step 550), e.g., using standard encryption algorithm and a fixed key. There is no need for secrecy in this case because all that is desired is a result where there are approximately the same number of ones and zeros. Typical encryption algorithms produce output with this property. Alternatively, a cyclic redundancy check (CRC) of the memory error map may be generated. A third alternative for turning the memory error map into an identifier uses the offsets between bits of value 1 as the identifier. In any event, the ECC checking can be performed with a configuration of the FPGA.

In some embodiments, testing of memory may be done every time the device is powered-on. In other embodiments, testing of memory may be done after device manufacture, and information necessary to bypass defective memory may be stored using non-volatile memory. In these embodiments, the memory error map may be read from the information stored to bypass defective memory, without requiring the memory be re-tested every time the device is powered-on.

Figure 6:
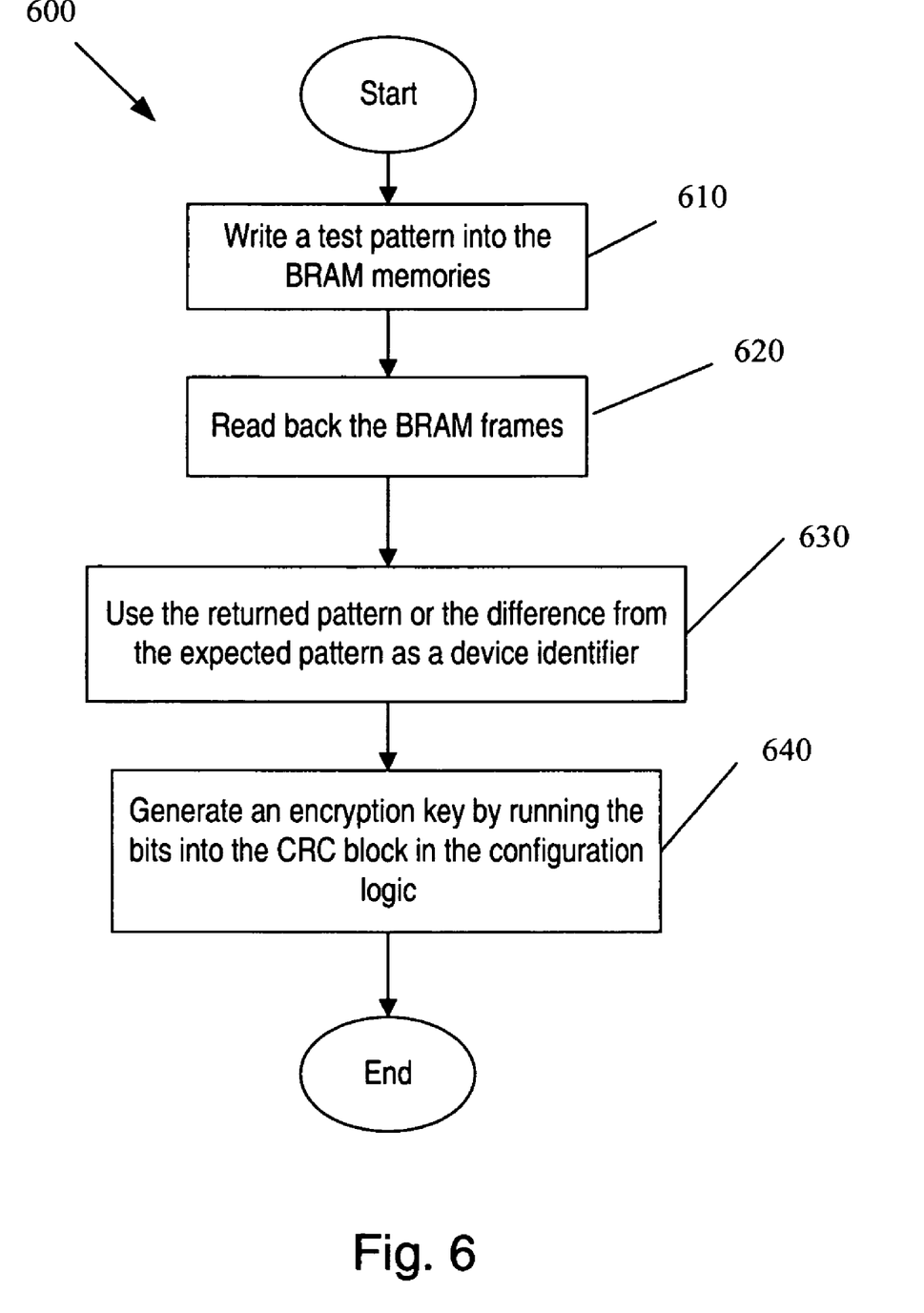
FIG. 6 is a flow chart of a method for identifying a particular device using memory defects according to a second embodiment of the present invention.

FIG. 6 is a flow chart 600 of a method for identifying a particular device using memory defects according to a second embodiment of the present invention. If the ECC bits are inaccessible, the memory must be checked from the configuration port. Using the standard configuration write mechanism, a test pattern is written into the BRAM memories (step 610), e.g., all 0, all 1 or a checkerboard pattern. Then the BRAM frames are read back (step 620). The returned pattern or the difference from the expected pattern may be used as a device identifier (step 630). An encryption key may be generated by running the bits into the CRC block in the configuration logic (step 640). As with the embodiment of FIG. 5 involving the processing of the error map to derive a value for the device identifier, the returned pattern or difference may be further processed to derive a value of suitable size or uniqueness for use as a device identifier.

Figure 7:
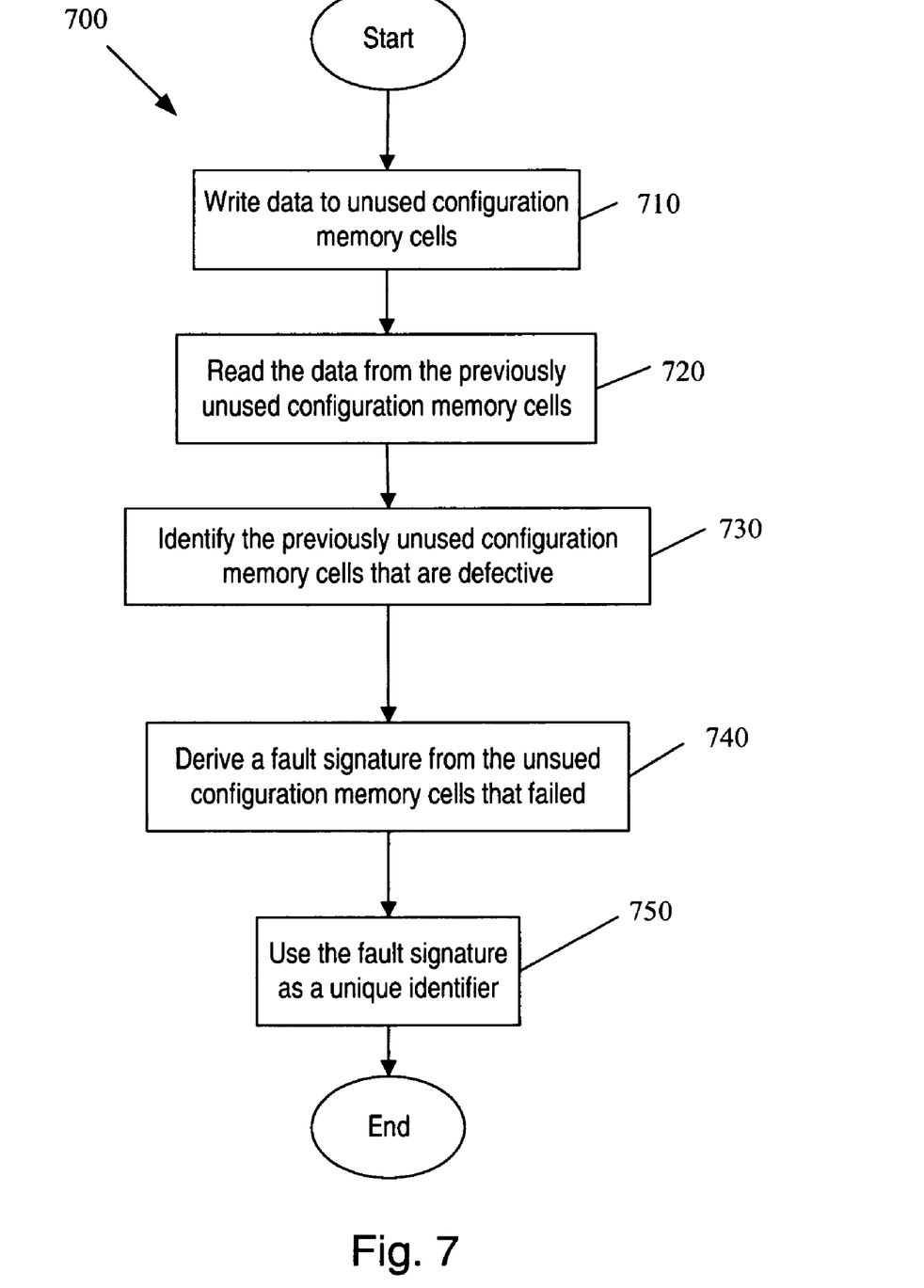
FIG. 7 is a flow chart of a method for identifying a particular device using memory defects according to another embodiment of the present invention.

FIG. 7 is a flow chart 700 of a method for identifying a particular device using memory defects according to another embodiment of the present invention. Some memory cells in a configuration map may be unused (more memory cells than needed by the configurable logic may be present on the device). A failure in any one of these unused cells would not cause the device to fail when a PLD is programmed with any particular design, and those unused memory cells may be used to generate a device identifier.

Data is written to the unused configuration memory cells of a PLD (step 710), and after the data is written a readback is performed for the unused configuration memory cells (step 720). A comparison of the data read back to the data originally written is used to identify the defective ones of the unused configuration memory cells (step 730). The pattern produced by those failing, unused cells, or the difference from the originally written data may be used to derive a fault signature for the device (step 740). The derivation of the fault signature may be performed as described above in the embodiments of FIG. 5 and FIG. 6 for producing a value of suitable size and uniqueness if desired. The fault signature derived from the identification of the defective configuration memory cells may then be used as a device identifier (step 750).

Figure 8:
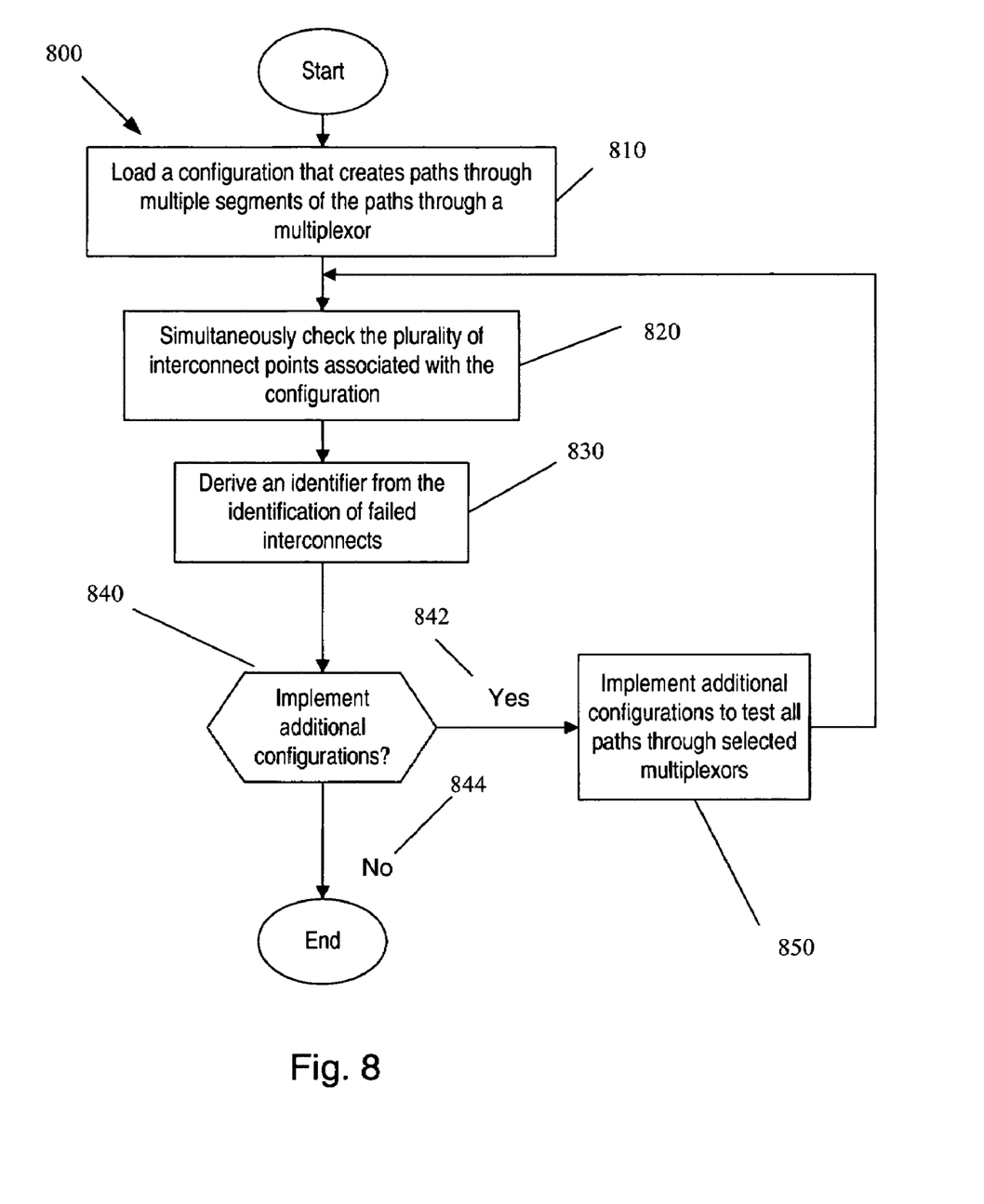
FIG. 8 is a flow chart of a method for identifying a particular device using memory defects according to yet another embodiment of the present invention.

FIG. 8 is a flow chart 800 of a method for identifying a particular device using memory defects according to yet another embodiment of the present invention. General interconnect tests are difficult because configurable interconnect points consist of wide multiplexors controlled by configuration memory cells, and testing all paths through the multiplexors would require many configurations of the PLD. According to the flow chart 800 of the method shown in FIG. 8, a configuration is loaded that creates paths through the multiplexors of multiple interconnect points (step 810). The plurality of interconnect points associated with the configuration are checked simultaneously by transmitting signals on the paths under test (step 820), and the interconnects of each failed path may be used to derive a device identifier (step 830). The failed interconnect data may be processed as described above to produce a suitably sized and unique device identifier if desired. A decision is made whether to implement additional configurations to test additional paths (decision 840). Whether additional paths are tested may depend on the number of interconnect points desired for a suitable device identifier. If yes (path 842), additional configurations may be implemented to test all paths through selected ones of the multiplexors of the PLD (step 850). If not (path 844), the process ends.

Figure 9:
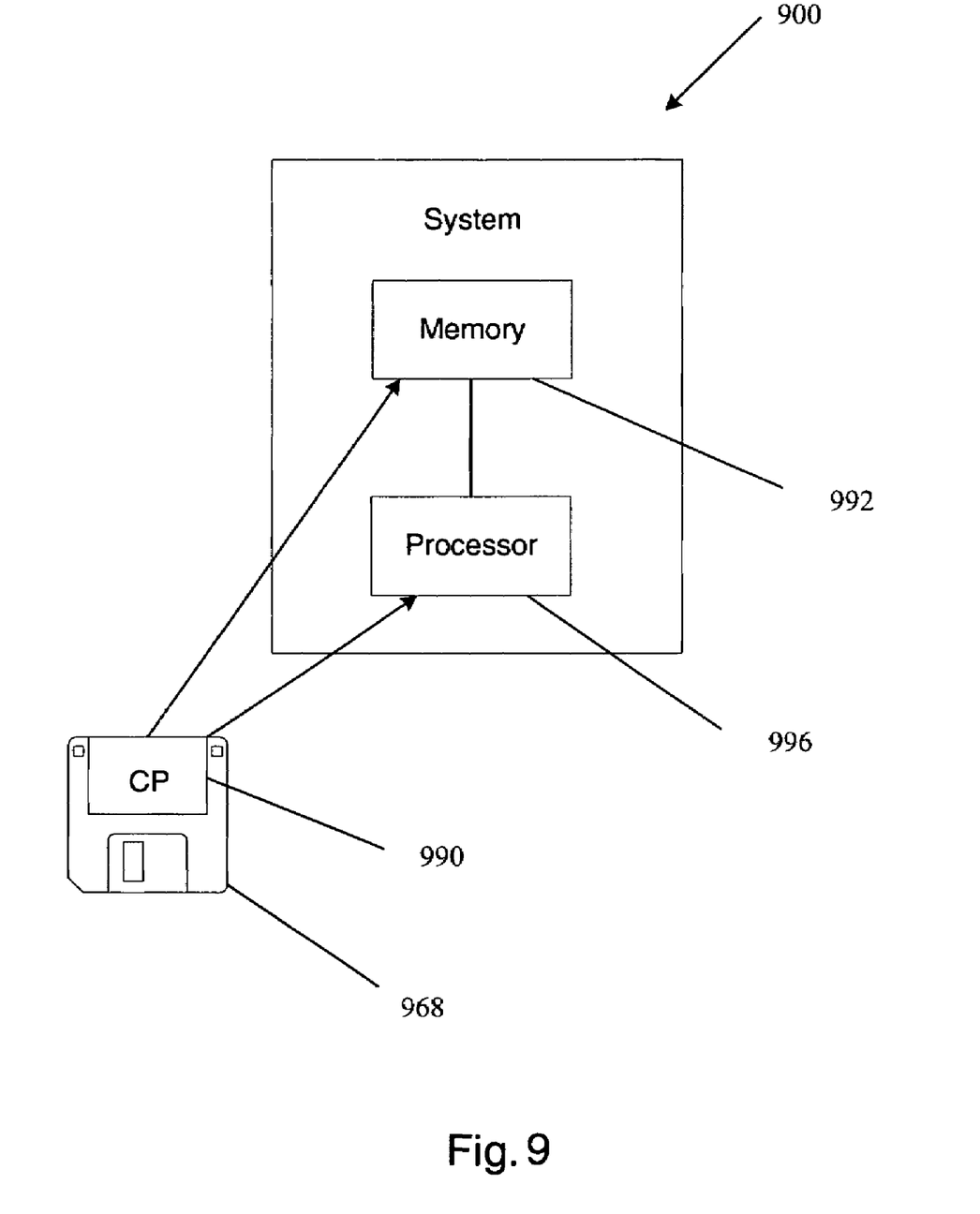
FIG. 9 illustrates a system and program storage device tangibly embodying the process for providing an identifier for a device using defects in memory of the device according to an embodiment of the present invention.

FIG. 9 illustrates a system 900 according to an embodiment of the present invention, wherein the process illustrated with reference to FIGS. 1-8 may be tangibly embodied in a computer-readable medium or carrier, e.g. one or more of the fixed and/or removable data storage devices 968 illustrated in FIG. 9, or other data storage or data communications devices. A computer program 990 expressing the processes embodied on the removable data storage devices 968 may be loaded into the system 900, e.g., memory 992 or processor 996, to configure the system 900 of FIG. 9, for execution. The computer program 990 comprise instructions which, when read and executed by the system 900 of FIG. 9, causes the system 900 to perform the steps necessary to execute the steps or elements of the present invention The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for providing an identifier for an integrated circuit, comprising;
   writing data to memory of the integrated circuit;
   wherein the integrated circuit is a field programmable gate array (FPGA) and the writing data to memory of the integrated circuit comprises loading configuration data into configuration memory cells of the FPGA that controls interconnect multiplexors and forms paths through multiple interconnect multiplexors of the FPGA;
   identifying defects based upon the writing of the data;
   wherein the identifying includes generating a set of bits that identifies cells of the memory that are defective;
   the identifying defects based upon the writing of the data further comprises checking signals transmitted on the paths through the multiple interconnect multiplexors and identifying each path failing to transmit a signal;
   deriving an identifier for the integrated circuit using the identification of the defects;
   wherein the deriving includes generating a value from the set of bits that identifies defective memory cells, wherein the value is represented with fewer bits than the set of bits; and
   wherein the deriving an identifier for the FPGA using the identification of the defects comprises generating an identifier for the FPGA using the identification of each path failing to transmit a signal; and
   storing the value.

2. The method of claim 1, wherein the storing includes storing the identifier on the integrated circuit.

3. The method of claim 1, wherein the storing includes storing the identifier on a non-volatile memory die stacked on the integrated circuit.

4. The method of claim 1, wherein the generating includes generating an encryption key based on the set of bits that identify the defective memory cells.

5. The method of claim 1, wherein the generating includes encrypting the set of bits that identifies the defective memory cells.

6. The method of claim 1, wherein the generating includes combining the set of bits with a timestamp.

7. An integrated circuit (IC) for providing an identifier based on memory cell defects, comprising:
   a field programmable gate array (FPGA);
   a configurable array of memory cells, the array comprising a first portion storing user data and a second portion storing error correction code (ECC) data, the array having a read port;
   wherein the array of memory cells configures resources of the FPGA;
   an ECC generation and correction circuit having a plurality of input terminals coupled to the read port of the array and a first plurality of output terminals; and
   a controller, coupled to the configurable array of memory cells, the controller configurable to write data to memory cells of the integrated circuit, to identify defects based upon the data written to the memory cells and to derive an identifier for the integrated circuit using the identification of the defects,
   wherein the controller writes data to the memory cells by loading configuration data into configuration memory cells that controls interconnect multiplexors and forms paths through multiple interconnect multiplexors of the FPGA, identifies defects by checking signals transmitted on the paths through the multiple interconnect multiplexors and identifying each path failing to transmit a signal, and derives an identifier for the FPGA using the identification of the defects by generating an identifier for the FPGA using the identification of each path failing to transmit a signal,
   wherein the controller is further configurable to generate a set of bits that identifies cells of the memory that are defective, generate a value from the set of bits that identifies defective memory cells, wherein the value is represented with fewer bits than the set of bits, and store the value.

8. The IC of claim 7 further comprising generating an encryption key based on the identifier.

9. A program storage device, comprising:
   program instructions executable by a processing device to perform operations for providing an identifier for an integrated circuit, the operations comprising
   writing data to memory of the integrated circuit;
   wherein the integrated circuit is a field programmable gate array (FPGA);

wherein the writing data to memory of the integrated circuit comprises loading configuration data into configuration memory cells of the FPGA that controls interconnect multiplexors and forms paths through multiple interconnect multiplexors of the FPGA;

identifying defects based upon the writing of the data;

wherein the identifying defects based upon the writing of the data further comprises checking signals transmitted on the paths through the multiple interconnect multiplexors and identifying each path failing to transmit a signal;

wherein the identifying includes generating a set of bits that identifies cells of the memory that are defective;

deriving an identifier for the integrated circuit using the identification of the defects;

wherein the deriving an identifier for the FPGA using the identification of the defects comprises generating an identifier for the FPGA using the identification of each path failing to transmit a signal;

wherein the deriving includes generating a value from the set of bits that identifies defective memory cells, wherein the value is represented with fewer bits than the set of bits; and storing the value.

* * * * *